United States Patent
Schmidt et al.

(10) Patent No.: US 7,901,592 B2
(45) Date of Patent: Mar. 8, 2011

(54) ILLUMINATION SYSTEM COMPRISING A GREEN-EMITTING CERAMIC LUMINESCENCE CONVERTER

(75) Inventors: Peter Schmidt, Aachen (DE); Volker Bachmann, Aachen (DE); Silvia Golsch, Wurselen (DE); Wolfgang Busselt, Roetgen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 830 days.

(21) Appl. No.: 11/816,262

(22) PCT Filed: Feb. 10, 2006

(86) PCT No.: PCT/IB2006/050441
§ 371 (c)(1),
(2), (4) Date: Aug. 14, 2007

(87) PCT Pub. No.: WO2006/087660
PCT Pub. Date: Aug. 24, 2006

(65) Prior Publication Data
US 2010/0127286 A1    May 27, 2010

(30) Foreign Application Priority Data
Feb. 17, 2005  (EP) .................... 05101197

(51) Int. Cl.
*H05B 33/14*  (2006.01)
*C09K 11/66*  (2006.01)
*C09K 11/79*  (2006.01)

(52) U.S. Cl. ............ 252/301.4 F; 252/301.6 F; 313/503; 257/98

(58) Field of Classification Search ............ 252/301.4 F, 252/301.6 F; 313/503; 257/98
See application file for complete search history.

(56) References Cited

U.S. PATENT DOCUMENTS

| | | | |
|---|---|---|---|
| 7,361,938 B2 * | 4/2008 | Mueller et al. | 257/94 |
| 2003/0132422 A1 | 7/2003 | Tian | |
| 2006/0076883 A1 * | 4/2006 | Himaki et al. | 313/503 |

FOREIGN PATENT DOCUMENTS

| | | | |
|---|---|---|---|
| EP | 1413618 | | 4/2004 |
| JP | 2004182781 | | 7/2004 |
| WO | WO2004036962 A1 | | 4/2004 |
| WO | WO 2004/039915 | * | 5/2004 |
| WO | WO2004065324 A1 | | 5/2004 |
| WO | 2005030905 | | 4/2005 |

* cited by examiner

*Primary Examiner* — C. Melissa Koslow
(74) *Attorney, Agent, or Firm* — Larry Liberchuk

(57) ABSTRACT

An Illumination system comprising a radiation source and a monolithic ceramic luminescence converter comprising at least one phosphor capable of absorbing a part of the light emitted by the radiation source and emitting light of a wavelength different from that of the absorbed light, wherein said at least one phosphor is an europium(II)-activated oxonitridosilicate of the general formula $(Sr_{1-a-b-c-d-e-f}Ca_bBa_cMg_dZn_eCe_f)Si_{x-g}Ge_gN_yO_z:Eu_a$, wherein $0.001 < a < 0.2$, $0.0 < b < 1.0$, $0.0 < c < 0.5$, $0.0 < d < 0.25$, $0.0 < e < 0.25$, $0.0 < f < 0.2$, $0.0 < g < 1.0$, $1.5 < x < 2.5$, $1.5 < y < 2.5$ and $1.5 < z < 2.5$.

5 Claims, 4 Drawing Sheets

ILLUMINATION SYSTEM COMPRISING A GREEN-EMITTING CERAMIC LUMINESCENCE CONVERTER

BACKGROUND OF THE INVENTION

The present invention generally relates to an illumination system comprising a radiation source and a green-emitting ceramic luminescence converter. The invention also relates to a green-emitting ceramic luminescence converter for use in such an illumination system.

More particularly, the invention relates to an illumination system and a green-emitting ceramic luminescence converter for the generation of specific, colored light, including white light, by luminescent down conversion and additive color mixing based on an ultraviolet or blue radiation-emitting radiation source. A light emitting diode as a radiation source is especially contemplated.

Today, light emitting illumination systems comprising visible colored light emitting diodes as radiation sources are used either single or in clusters for all kinds of applications where rugged, compact, lightweight, high-efficiency, long-life, low-voltage sources of white or coloured illumination are needed.

Such applications comprise, inter alia, illumination of small LCD displays in consumer products such as cellular phones, digital cameras and hand-held computers. Pertinent uses include also status indicators on such products as computer monitors, stereo receivers, CD players, VCRs, and the like. Such indicators are also found in systems such as instrument panels in aircraft, trains, ships, cars, etc.

Multi-color combinations of pluralities of visible, colored LEDs in addressable arrays containing hundreds or thousands of LED components are found in large-area displays, such as full-color video walls and also high-brightness large-area outdoor television screens. Green, amber and red-emitting LEDs are increasingly being used for traffic lights or in effect lighting of buildings.

Conventional visible, colored-light emitting diodes, however, are typically subject to a low light output and are considered difficult to manufacture with uniform emission characteristics from batch to batch. The LEDs can also exhibit large wavelength variations across the wafer within a single batch as well as strong wavelength and emission variations resulting from operating conditions such as drive current and temperature. This applies especially to green-emitting LEDs.

Therefore, when generating white light with an arrangement comprising visible, colored-light emitting diodes, there has been the problem that white light of the desired tone cannot be generated due to variations in tone, luminance and other factors of the visible, colored-light emitting diodes.

It is known that visible, white or colored light illumination can be provided by converting the color of light emitting diodes emitting in the UV to blue range of the electromagnetic spectrum by means of a luminescent material comprising a phosphor.

Such phosphor-enhanced "white" LED systems are based in particular on the dichromatic (BY) approach, i.e. mixing yellow and blue colors, in which case the yellow secondary component of the output light may be provided by a yellow phosphor and the blue component may be provided by a phosphor or by the primary emission of a blue LED.

Likewise, white illumination systems are based on the trichromatic (RGB) approach, i.e. on mixing three colors, namely red, green and blue, in which case the red and green component may be provided by a phosphor and the blue component by the primary emission of a blue-emitting LED.

As recent advances in light-emitting diode technology have brought very efficient light emitting diodes emitting in the near UV to blue range, today a variety of colored and white-light emitting phosphor-converted light emitting diodes are on the market, challenging traditional incandescent or fluorescent lighting.

WO 2004036962 A1 discloses a light emitting device comprising a light emitting structure capable of emitting primary light of a wavelength less than 480 nm and a luminescent screen comprising a green phosphor of the general formula $(Sr_{1-a-b}Ca_bBa_cMg_dZn_e)Si_xN_yO_z:Eu_a$, wherein $0.002 \leq a \leq 0.2$, $0.0 \leq b \leq 0.25$, $0.0 \leq c \leq 0.25$, $0.0 \leq d \leq 0.25$, $0.0 \leq e \leq 0.25$, $1.5 \leq x \leq 2.5$, $1.5 \leq y \leq 2.5$ and $1.5 < z < 2.5$.

The prior art phosphor-enhanced light emitting device typically utilizes an arrangement in which a semiconductor chip having a blue-emitting LED thereon is covered by a layer of epoxy resin containing pigment particles of one or more conversion phosphors. These phosphor particles convert the blue light to white or colored light, as described above.

However, a problem in prior art illumination systems comprising microcrystalline phosphor powders is that they cannot be used for many applications because they have a number of drawbacks.

First, the deposition of a layer of uniform thickness is difficult. Since color uniformity requires a uniform thickness, color uniformity is difficult to guarantee. In areas where the phosphor is thicker, the light appears more greenish white, while in sections having a thinner phosphor layer the light appears bluish white.

Second, these conventional phosphor particles are polycrystalline. Polycrystalline phosphor tends to be opaque. As a result, the phosphor particles absorb light, which lowers the light output. In addition, particles scatter the blue light, leading to a lower light-extraction efficiency. Third, the particles tend to agglomerate, and hence, providing a uniform layer with particles of a known size is difficult.

BRIEF SUMMARY OF THE INVENTION

It is therefore an object to provide an illumination system for generating white light, which combines suitable light-extraction efficiency and transparency with true color rendition.

According to another object of the invention, an illumination system for generating green light is provided.

Thus, the present invention provides an illumination system comprising a radiation source and a monolithic ceramic luminescence converter comprising at least one phosphor capable of absorbing a part of the light emitted by the radiation source and emitting light of a wavelength different from that of the absorbed light, wherein said at least one phosphor is an europium(II)-activated oxonitridosilicate of the general formula $(Sr_{1-a-b-c-d-e-f}Ca_bBa_cMg_dZn_eCe_f)Si_{x-g}Ge_gN_yO_z:Eu_a$, wherein $0.001 \leq a \leq 0.2$, $0.0 \leq b \leq 1$, $0.0 \leq c \leq 0.5$, $0.0 \leq d \leq 0.25$, $0.0 \leq e \leq 0.25$, $0.0 \leq f \leq 0.2$, $0.0 < g < 1.0$, $1.5 \leq x \leq 2.5$, $1.5 \leq y \leq 2.5$ and $1.5 < z < 2.5$.

As the monolithic, ceramic luminescence converter is translucent, it does not impede the transmission of light and scattering is minimized. The monolithic, ceramic luminescence converter is easily machined to a uniform thickness, so the color conversion effect is the same across the surface, providing a more uniform composite light than the prior art devices.

Preferably said radiation source is a light emitting diode.

According to one embodiment of the invention, said monolithic ceramic luminescence converter is a first luminescence converter element, further comprising one or more second luminescence converter elements.

The second luminescence converter element may be a coating comprising a second phosphor as the luminescent material. Alternatively, the second luminescence converter element may be a second monolithic ceramic luminescence converter comprising a second phosphor.

According to another aspect of the invention, a ceramic illumination converter comprising at least one phosphor capable of absorbing a part of the light emitted by the radiation source and emitting light of a wavelength different from that of the absorbed light, wherein said at least one phosphor is an europium(II)-activated oxonitridosilicate of the general formula $(Sr_{1-a-b-c-d-e-f}Ca_bBa_cMg_dZn_eCe_f)Si_{x-g}Ge_gN_yO_z{:}Eu_a$, wherein $0.001 \leq a \leq 0.2$, $0.0 \leq b \leq 1.0$, $0.0 \leq c \leq 0.5$, $0.0 \leq d \leq 0.25$, $0.0 \leq e \leq 0.25$, $0.0 \leq f \leq 0.2$, $0.0 < g < 1$, $1.5 \leq x \leq 2.5$, $1.5 \leq y \leq 2.5$ and $1.5 < z < 2.5$, is provided.

Such a converter is effective, as it is a good converter for high-energy radiation, such as radiation in the UV to blue range of the electromagnetic spectrum. It is also effective, because it is a good transmitter of the light energy that results from the conversion of the high-energy radiation input. Otherwise the light would be absorbed in the material and the overall conversion efficiency would be affected.

DETAILED DESCRIPTION OF THE INVENTION

Monolithic Ceramic Luminescence Converter

The present invention focuses on a monolithic ceramic luminescence converter (CLC) comprising an europium(II)-activated oxonitridosilicate phosphor of the general formula $(Sr_{1-a-b-c-d-e-f}Ca_bBa_cMg_dZn_eCe_f)Si_{x-g}Ge_gN_yO_z{:}Eu_a$, wherein $0.001 \leq a \leq 0.2$, $0.0 \leq b \leq 1.0$, $0.0 \leq c \leq 0.5$, $0.0 \leq d \leq 0.25$, $0.0 \leq e \leq 0.25$, $0.0 \leq f \leq 0.2$, $0.0 < g < 1.0$, $1.5 \leq x \leq 2.5$, $1.5 \leq y \leq 2.5$ and $1.5 < z < 2.5$, in any configuration of an illumination system comprising a source of primary radiation, including, but not limited to, discharge lamps, fluorescent lamps, LEDs, LDs, OLEDs and X-ray tubes. As used herein, the term "radiation" encompasses radiation in the UV, IR and visible regions of the electromagnetic spectrum.

In general, a monolithic ceramic luminescence converter is a ceramic body, which emits electromagnetic radiation in the visible or near visible spectrum when stimulated by high-energy electromagnetic photons.

A monolithic ceramic luminescence converter is characterized by its typical microstructure. The microstructure of a monolithic ceramic luminescence converter is polycrystalline, i.e. an irregular conglomerate of cryptocrystalline, microcrystalline or nanocrystalline crystallites. Crystallites are grown so as to come into close contact and share grain boundaries. Macroscopically the monolithic ceramic seems to be isotropic, however, the polycrystalline microstructure may be easily detected by SEM (scanning electron microscopy).

The monolithic ceramic luminescence converter may also contain second phases at the grain boundaries of its crystallites, which change the light scattering properties of the ceramic. Such intergranular material can scatter light and thus increase the light path in the ceramic material due to a contrast of refractive index at the grain boundary. The second phase material may be crystalline or vitreous.

Due to their monolithic polycrystalline microstructure, ceramic luminescence converters are transparent or have at least high optical translucency with low light absorption.

CLC Comprising Green-emitting Europium-activated Oxonitridosilicate Phosphor

The monolithic ceramic luminescence converter according to the invention comprising europium(II)-activated oxonitridosilicate of the general formula $(Sr_{1-a-b-c-d-e-f}Ca_bBa_cMg_dZn_eCe_f)Si_{x-g}Ge_gN_yO_z{:}Eu_a$, wherein $0.001 \leq a \leq 0.2$, $0.0 \leq b \leq 1$, $0.0 \leq c \leq 0.5$, $0.0 \leq d \leq 0.25$, $0.0 \leq e \leq 0.25$, $0.0 \leq f \leq 0.2$, $0.0 < g < 1.0$, $1.5 \leq x \leq 2.5$, $1.5 \leq y \leq 2.5$ and $1.5 < z < 2.5$, has a high degree of physical integrity, which property renders the material useful for machining, structuring and polishing to improve light extraction and enable light-guiding effects.

This class of phosphor material is based on europium(II)-activated luminescence of an oxygen-substituted nitridosilicate. The phosphor comprises a host lattice and dopant ions. The host lattice has a layered structure comprising stacks of alternating layers of $[Si_2N_{6/3}O_{2/1}]$, wherein silicon is tetrahedrically surrounded by nitrogen and oxygen. The cations of metals such as earth alkaline metals and zinc as well as europium(II) and, eventually, cerium as a co-activator are embedded between these layers, see FIG. 7.

Preferably, the earth alkaline metals are selected from calcium and strontium. The host lattice for those materials may be five-element (two-cation) oxonitridosilicate, such as europium(II)-activated strontium oxonitridosilicate $SrSi_2N_2O_2{:}Eu$, for example, or may comprise more than five elements, such as europium(II)-activated strontium-barium oxonitridosilicate $(Sr,Ba)Si_2N_2O_2{:}Eu$, for example.

The proportion z of europium(II) is preferably in the range of $0.001 < a < 0.2$. When the proportion z of Eu(II) is lower, luminance decreases because the number of excited emission centers of photoluminescence due to europium(II)-cations decreases and, when a is greater than 0.2, density quenching occurs. Density quenching refers to the decrease in emission intensity that occurs when the concentration of an activation agent added to increase the luminance of the fluorescent material is increased beyond an optimum level.

These europium(II)-activated oxonitridosilicate phosphors are responsive to more energetic portions of the electromagnetic spectrum than just the visible portion of the spectrum.

In particular, the phosphors according to the invention are especially excitable by UV emission lines that have such wavelengths as 200 to 420 nm, but are also excited with high efficiency by LED light emitted by a blue light-emitting component having a wavelength in the range of 400 to 495 nm. Thus, the fluorescent material of the monolithic ceramic luminescence converter has ideal characteristics for converting blue light from a nitride semiconductor light emitting component into white or colored green light. As shown in FIG. 8, a phosphor-converted light emitting diode according to the invention efficiently converts light emitted by a blue emitting diode into green light with a peak wavelength of 539 nm.

Manufacturing of the Monolithic Ceramic Luminescence Converter

The monolithic ceramic luminescence converter according to the invention is manufactured by preparing, in a first step, a fluorescent microcrystalline phosphor powder material and, in a second step, isostatically pressing the microcrystalline material into pellets and sintering the pellets at an elevated temperature and for a period of time sufficient to allow compaction to an optically translucent body.

The method of producing a microcrystalline phosphor powder of the present invention is not particularly restricted, and said microcrystalline phosphor powder can be produced by any method capable of providing phosphors according to the invention. A series of compositions of the general formula $(Sr_{1-a-b-c-d-e-f}Ca_bBa_cMg_dZn_eCe_f)Si_{x-g}Ge_gN_yO_z{:}Eu_a$, wherein $0.001 \leq a \leq 0.2$, $0.0 \leq b \leq 1.0$, $0.0 \leq c \leq 0.5$, $0.0 \leq d \leq 0.25$, $0.0 \leq e \leq 0.25$, $0.0 \leq f \leq 0.2$, $0.0 < g < 1.0$, $1.5 \leq x \leq 2.5$, $1.5 \leq y \leq 2.5$ and $1.5 < z < 2.5$ can be manufactured, which form homogeneous ceramics for the range of $1.5 < x \leq 2.5$, $1.5 < y \leq 2.5$ and $1.5 < z \leq 2.5$.

A preferred process for producing a phosphor according to the invention is referred to as the solid-state method. In this process, the phosphor precursor materials are mixed in the solid state and are heated so that the precursors react and form a powder of the phosphor material.

In a specific embodiment, these yellow to green-emitting phosphors are prepared as phosphor powders by the following technique: To prepare the mixed oxides of the divalent metals, high purity nitrates, carbonates, oxalates and acetates of the earth alkaline metals or zinc and europium(III) were dissolved by stirring in 25-30 ml of deionized water. The solutions are stirred while being heated on a hotplate until the water has evaporated, resulting in a white or yellow paste, depending on the composition.

The solids are dried overnight (12 hours) at 120° C. The resulting solid is finely ground and placed into a high-purity alumina crucible. The crucibles are loaded into a charcoal-containing basin and subsequently into a tube furnace, after which they are purged with flowing nitrogen/hydrogen for several hours. The furnace parameters are 10° C./min to 1300° C., followed by a 4-hour dwell at 1300° C., after which the furnace is turned off and allowed to cool to room temperature.

These metal oxides are mixed with silicon nitride $Si_3N_4$, silicon oxide $SiO_2$ and a flux in predetermined ratios.

The mixture is placed into a high-purity alumina crucible. The crucibles are loaded into a charcoal-containing basin and, subsequently, into a tube furnace and purged with flowing nitrogen/hydrogen for several hours. The furnace parameters are 10° C./min to 1200° C., followed by a 4-hour dwell at 1200° C., after which the furnace is slowly cooled to room temperature.

The samples are once again finely ground before a second annealing step at 1300° C. is performed. Luminous output may be improved through an additional third anneal at slightly lower temperatures in flowing argon.

Phosphor powder materials can also be made by liquid precipitation. In this method, a solution, which includes soluble phosphor precursors, is chemically treated to precipitate phosphor particles or phosphor particle precursors. These particles are typically calcined at an elevated temperature to produce the phosphor compound.

In yet another method, phosphor powder particle precursors or phosphor particles are dispersed in a slurry, which is then spray-dried to evaporate the liquid. The particles are subsequently sintered in the solid state at an elevated temperature to crystallize the powder and form a phosphor. The spray-dried powder is then converted to an oxonitridosilicate phosphor by sintering at an elevated temperature to crystallize the powder and to form the phosphor. The fired powder is then lightly crushed and milled to recover phosphor particles of desired particle size.

The fine-grained microcrystalline phosphor powders obtained by these methods are used to prepare a ceramic luminescence converter according to the invention. To this aim, a suitable phosphor powder is subjected to a very high pressure either in combination with a treatment at elevated temperature or followed by a separate heat treatment. Isostatic pressing is preferred.

Especially preferred is a hot isostatic pressure treatment, or otherwise a cold isostatic pressure treatment followed by sintering. A combination of cold isostatic pressing and sintering followed by hot isostatic pressing may also be applied.

Careful supervision of the densification process is necessary to control grain growth and to remove residual pores.

Pressing and heat treatment of the phosphor material results in a monolithic ceramic body, which is easily sawed, machined and polished by current metallographic procedures. The polycrystalline ceramic material can be sawed into wafers, which are 1 millimeter or less in width. Preferably, the ceramic is polished to get a smooth surface and to impede diffuse scattering caused by surface roughness.

Specific Embodiment

Preparation of $Sr_{0.96}Si_2N_2O_2:Eu_{0.04}$ 208.9 g (1.415 mol) $SrCO_3$ is mixed with 12.3 g (0.059 mol) $EuF_3$ and 206.8 g (4.423 mol) $Si_3N_4$ (min. 98% purity) in dry ethanol under argon. The ethanol is evaporated in a stream of argon and the dried powder mixture is then fired at 1300° C. for 1 hr. in an $H_2/N_2$ atmosphere over charcoal in a tungsten boat. After milling, the powder is fired at 1300° C. for 2 hr. in an $H_2/N_2$ atmosphere, milled and washed with water several times.

The raw phosphor powder is mixed with an organic glycol binder, pressed into pellets and further densified by cold isostatic pressing at 44800 Psi. The ceramic green (=non-fired) bodies are then placed on a tungsten foil and fired at 1600° C. for two hours in the same reducing atmosphere as described above. After cooling down to room temperature, the nitride ceramics obtained were sawed into wavers. These wavers were ground and polished to obtain the final translucent nitride ceramics.

The CLC microstructure features a statistical granular structure of crystallites forming a grain boundary network.

The ceramics exhibit a density of 98% of the theoretical density of $SrSi_2N_2O_2$ (3.743 g/cm³). The density of the samples can further be improved by hot isostatic pressing of the ceramics in a nitrogen atmosphere (temperature range: 1600-1780° C., pressure range: 2000-30000 PSI) to remove any remaining internal porosity.

The phosphor ceramics were characterized by powder X-ray diffraction (Cu, Kα-line). FIG. 7 shows the X-ray diffraction diagram of the monolithic ceramic luminescence converter, which is similar to the X-ray diffraction diagram of $SrSi_2N_2O_2$ besides some small deviations due to introduction of the dopant europium(II)-cation.

Phosphor-converted Light Emitting Device Comprising Green-emitting CLC

According to one aspect of the invention, an illumination system, comprising a radiation source and a monolithic ceramic luminescence converter comprising at least one phosphor capable of absorbing a part of the light emitted by the radiation source and emitting light of a wavelength different from that of the absorbed light, wherein said at least one phosphor is an europium(II)-activated oxonitridosilicate of the general formula $(Sr_{1-a-b-c-d-e-f}Ca_bBa_cMg_dZn_eCe_f)Si_{x-g}Ge_gN_yO_z:Eu_a$, wherein $0.001 \leq a \leq 0.2$, $0.0 \leq b \leq 1$, $0.0 \leq c \leq 0.5$, $0.0 \leq d \leq 0.25$, $0.0 \leq e \leq 0.25$, $0.0 \leq f \leq 0.2$, $0.0 < g < 1.0$, $1.5 \leq x \leq 2.5$, $1.5 \leq y \leq 2.5$ and $1.5 < z < 2.5$, is provided.

While the present monolithic ceramic luminescence converter is contemplated for a wide array of illumination applications, the present invention is described with particular reference to, and finds particular application in, illumination systems comprising radiation sources, which are preferably semiconductor optical radiation emitters and other devices that emit optical radiation in response to electrical excitation. Semiconductor optical radiation emitters include light emitting diode LED chips laser diodes (LDs), light emitting polymers (LEPs), organic light emitting devices (OLEDs), polymer light emitting devices (PLEDs), etc.

Any configuration of an illumination system which includes a light emitting diode, or an array of light emitting diodes, and a ceramic luminescence converter comprising a europium(II)-activated oxonitridosilicate phosphor of the general formula $(Sr_{1-a-b-c-d-e-f}Ca_bBa_cMg_dZn_eCe_f)Si_{x-g}Ge_gN_yO_z:Eu_a$, wherein $0.001 \leq a \leq 0.2$, $0.0 \leq b \leq 1$, $0.0 \leq c \leq 0.5$, $0.0 \leq d \leq 0.25$, $0.0 \leq e \leq 0.25$, $0.0 \leq f \leq 0.2$, $0.0 < g < 1.0$, $1.5 \leq x \leq 2.5$, $1.5 \leq y \leq 2.5$ and $1.5 < z < 2.5$, is contemplated in the present invention, preferably with the addition of other well-known phosphors, which can be combined to achieve a specific color or white light when irradiated by a LED emitting primary UV or blue light as specified above.

Possible configurations useful for coupling the monolithic ceramic luminescence converter to a light emitting diode or an array of light emitting diodes comprise lead frame-mounted LEDs as well as surface-mounted LEDS.

A detailed construction of one embodiment of such an illumination system comprising a radiation source and a monolithic ceramic luminescence converter shown in FIG. 1 will now be described.

FIG. 1 shows a schematic view of a lead-frame mounted type of light emitting diode with a ceramic luminescence converter.

The light emitting diode element 1 placed within the reflection cup 3 is a small chip shaped in the form of a cube and has electrodes 5 provided at the lower and upper surface thereof. The backside electrode is bonded to the cathode electrode with conductive glue. The topside (?) electrode is electrically connected to the anode electrode via a bond wire 4.

A monolithic ceramic luminescence converter 2 is provided in the reflection cup. The monolithic ceramic luminescence converter is configured as a plate, which is positioned in such a way that most of the light, which is emitted from the light-emitting diode, enters the plate at an angle which is approximately perpendicular to the surface of the plate. To achieve this, a reflector is provided around the light-emitting diode in order to reflect light that is emitted from the light-emitting diode in directions toward the plate.

In operation, electric power is supplied to the dice to activate the dice. When activated, the dice emit primary light, e.g. UV or visible blue light. A portion of the emitted primary light is completely or partially absorbed by the ceramic luminescence converter. The ceramic luminescence converter then emits secondary light, i.e., the converted light having a longer peak wavelength, which is primarily yellow to green in a sufficiently broad band in response to absorption of the primary light. The remaining unabsorbed portion of the emitted primary light is transmitted through the ceramic luminescence converter, along with the secondary light.

The reflector directs the unabsorbed primary light and the secondary light in a general direction as output light. Thus, the output light is a composite light that is composed of the primary light emitted from the die and the secondary light emitted from the fluorescent layer.

The color temperature or color point of the output light of an illumination system according to the invention will vary depending upon the spectral distributions and intensities of the secondary light in comparison to the primary light.

Firstly, the color temperature or color point of the primary light can be varied by a suitable choice of the light emitting diode.

Secondly, the color temperature or color point of the secondary light can be varied by a suitable choice of the specific phosphor composition in the ceramic luminescence converter.

It should be noted that multiple luminescence converting elements could also be utilized. For example, if a UV-emitting LED is utilized, at least two phosphors are needed to provide a light source that is perceived as being white by an observer. In this case, a second monolithic ceramic luminescence converter may be added. Alternatively, a resin-base luminescence converter may be added as a layer coating or an emitter package.

FIG. 2 shows a schematic view of a lead-frame mounted type of light emitting diode with two luminescence converters. The light emitting diode element 1 placed within the reflection cup 3 is encased in a protective coating 6 that is made of a transparent polymer material such as silicon, resin or epoxy. The protective coating has a luminescence-converting material distributed throughout it. The luminescence-converting material can be one or more fluorescent materials, such as a phosphor or a fluorescent dye.

The green-emitting monolithic ceramic luminescence converter according to the invention is positioned on top of the resin package.

Often, light emitting diodes are fabricated on insulating substrates, such as sapphire, with both contacts on the same side of the device. Such devices may be mounted so that light is extracted either through the contacts, in which case these devices are known as epitaxy-up devices, or through a surface of the device opposite the contacts, in which case they are known as flip chip devices.

FIG. 3 schematically illustrates a specific structure of a solid-state illumination system comprising a monolithic ceramic luminescence converter, wherein the chip is packaged in a flip chip configuration on a substrate, with both electrodes contacting the respective leads without using bond wires. The LED die is flipped upside down and bonded onto a thermally conducting substrate. A green-emitting monolithic ceramic luminescence converter according to the invention is attached to the top of the LED die.

A resin coating is formed over the exterior of the light emitting diode and the monolithic ceramic luminescence converter in which a second fluorescent material is dispersed.

In operation, the light emitted by the light emitting diode is wavelength converted by the monolithic ceramic luminescence converter and mixed with the wavelength-converted light of the second luminescence converter to provide white or colored light.

FIG. 4 shows a schematic side view of a green lamp comprising a ceramic luminescence converter of the present invention positioned in the pathway of light emitted by light-emitting diodes with a flip chip arrangement.

FIG. 5 illustrates a cross sectional view of multiple LEDs mounted on a board in combination with monolithic ceramic luminescence converters for use as a RGB display or light source.

The White Light Emitting Phosphor-converted Light Emitting Device

According to one aspect of the invention, the output light of the illumination system may have a spectral distribution such that it appears to be "white" light. So-called "white LEDs" actually use two, three or more colored light sources to simulate a white emitter.

Dichromatic White Light

In a first embodiment of a white-light emitting illumination system according to the invention, the device can advantageously be produced by choosing the luminescent material such that blue radiation emitted by a blue light emitting diode is converted into complementary wavelength ranges, to form dichromatic white light.

In this case, yellow to green light is produced by means of the phosphor material of the monolithic ceramic luminescence converter, that comprises a phosphor of the general formula $(Sr_{1-a-b-c-d-e-f}Ca_bBa_cMg_dZn_eCe_f)Si_{x-g}Ge_gN_yO_z:Eu_a$, wherein $0.001 \leq a \leq 0.2$, $0.0 \leq b \leq 1.0$, $0.0 \leq c \leq 0.5$, $0.0 \leq d \leq 0.25$, $0.0 \leq e \leq 0.25$, $0.0 \leq f \leq 0.2$, $0.0 < g < 1.0$, $1.5 \leq x \leq 2.5$, $1.5 \leq y \leq 2.5$ and $1.5 < z < 2.5$.

Particularly good results are achieved with a blue LED whose emission maximum lies at 380 to 480 nm. An optimum has been found to lie at 445 to 468 nm, taking particular account of the excitation spectrum of the europium(II)-activated oxonitridosilicates according to the invention.

A white-light emitting illumination system according to the invention can particularly preferably be realized by mounting a polished ceramic luminescence converter according to the invention with dimensions of 4×4×0.3 mm on an 1 W (Al,In,Ga)N LED chip emitting at 458 nm.

Part of blue radiation emitted by a 458 nm (Al,In,Ga)N light emitting diode is shifted by the europium(II)-activated oxonitridosilicate into the yellow to green spectral region and, consequently, into a wavelength range which is complementarily colored with respect to the color blue. A human observer perceives the combination of blue primary light and secondary light of the yellow to green-emitting phosphor as white light.

Polychromatic White Light

A second embodiment of a white-light emitting illumination system according to the invention can advantageously be produced by choosing the luminescent material such that blue radiation emitted by the blue-light emitting diode is converted into complementary wavelength ranges to form polychromatic, especially trichromatic, white light. In this case, white light is produced by means of luminescent materials that comprise a blend of phosphors including europium(II)-activated oxonitridosilicate phosphor as a first monolithic ceramic green luminescence converter and a second red phosphor in a second luminescence converter.

The second luminescence converter may be provided as a second monolithic ceramic luminescence converter or as a conventional phosphor coating.

Useful second phosphors and their optical properties are summarized in the following table:

| Composition | $\lambda_{max}$ [nm] | Color point x, y |
|---|---|---|
| $(Ba_{1-x}Sr_x)_2SiO_4$: Eu | 523 | 0.272, 0.640 |
| $SrGa_2S_4$: Eu | 535 | 0.270, 0.686 |
| $SrSi_2N_2O_2$: Eu | 541 | 0.356, 0.606 |
| SrS: Eu | 610 | 0.627, 0.372 |
| $(Sr_{1-x-y}Ca_xBa_y)_2Si_5N_8$: Eu | 615 | 0.615, 0.384 |
| $(Sr_{1-x-y}Ca_xBa_y)_2Si_{5-x}Al_xN_{8-x}O_x$: Eu | 615-650 | * |
| CaS: Eu | 655 | 0.700, 0.303 |
| $(Sr_{1-x}Ca_x)S$: Eu | 610-655 | * |

The color point variables x and y in the third column of the above table are the coordinates on a chromaticity diagram.

The color point variables x and y in the third column of the above table are the Coordinates on a chromaticity diagram.

The Green Emitting Phosphor-converted Light Emitting Device

A further group of embodiments is directed to an illumination system that emits output light having a spectral distribution such that it appears to be "yellow to green" light.

A monolithic ceramic luminescence converter comprising europium(II)-activated oxonitridosilicate of the general formula $(Sr_{1-a-b-c-d-e-f}Ca_bBa_cMg_dZn_eCe_f)Si_{x-g}Ge_gN_yO_z:Eu_a$, wherein $0.001 \leq a \leq 0.2$, $0.0 \leq b \leq 1.0$, $0.0 \leq c \leq 0.5$, $0.0 \leq d \leq 0.25$, $0.0 \leq e \leq 0.25$, $0.0 \leq f \leq 0.2$, $0.0 < g < 1.0$, $1.5 \leq x \leq 2.5$, $1.5 \leq y \leq 2.5$ and $1.5 < z < 2.5$, as a phosphor is particularly well suited as a yellow to green component for stimulation by a primary UVA or blue radiation source such as, for example, an UVA-emitting LED or blue-emitting LED.

It is possible thereby to implement an illumination system emitting in the yellow to green regions of the electromagnetic spectrum.

Particularly good results are achieved with a blue LED whose emission maximum lies at 400 to 480 nm. An optimum has been found to lie at 410 to 455 nm, taking particular account of the excitation spectrum of the europium-activated oxonitridosilicate according to the invention.

The color output of the LED—phosphor system is very sensitive to the thickness of the monolithic ceramic luminescence converter, i.e. if the converter thickness is high, then a lesser amount of the blue LED light will penetrate through the thick phosphor layer. The combined LED—phosphor system will then appear yellow to green, because it is dominated by the yellow to green secondary light of the phosphor. Therefore, the thickness of the monolithic ceramic luminescence is a critical variable affecting the color output of the system.

The hue (color point in the CIE chromaticity diagram) of the yellow to green light produced can in this case also be varied by a suitable choice of the specific phosphor composition.

In another embodiment, a yellow to green-light emitting illumination system according to the invention can advantageously be produced by choosing a radiation source such that UV radiation emitted by the UV emitting diode is converted entirely into monochromatic yellow to green light by a monolithic ceramic luminescence converter according to the invention.

Figure 1:
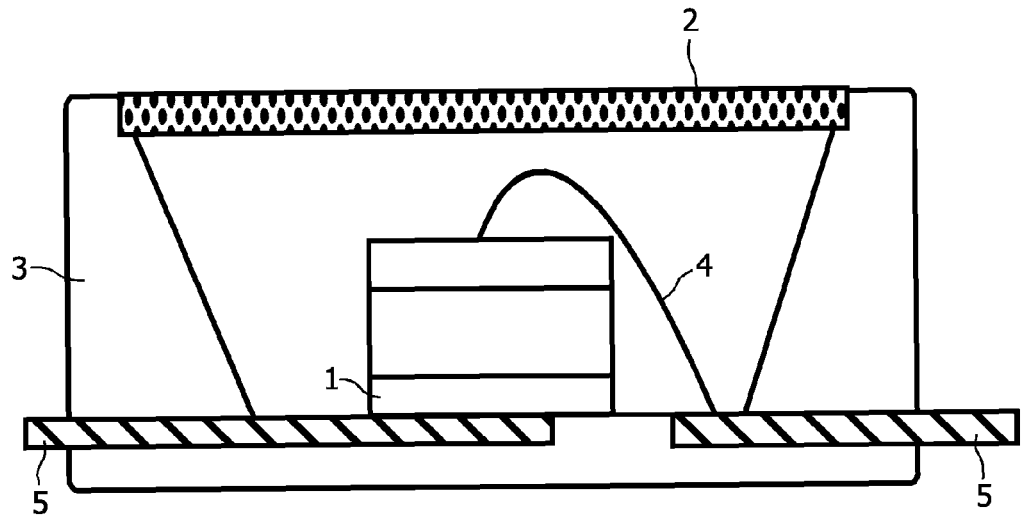
FIG. 1 shows a schematic side view of a dichromatic white LED lamp comprising a ceramic luminescence converter of the present invention positioned in the pathway of light emitted by a light-emitting diode lead-frame structure.
Figure 2:
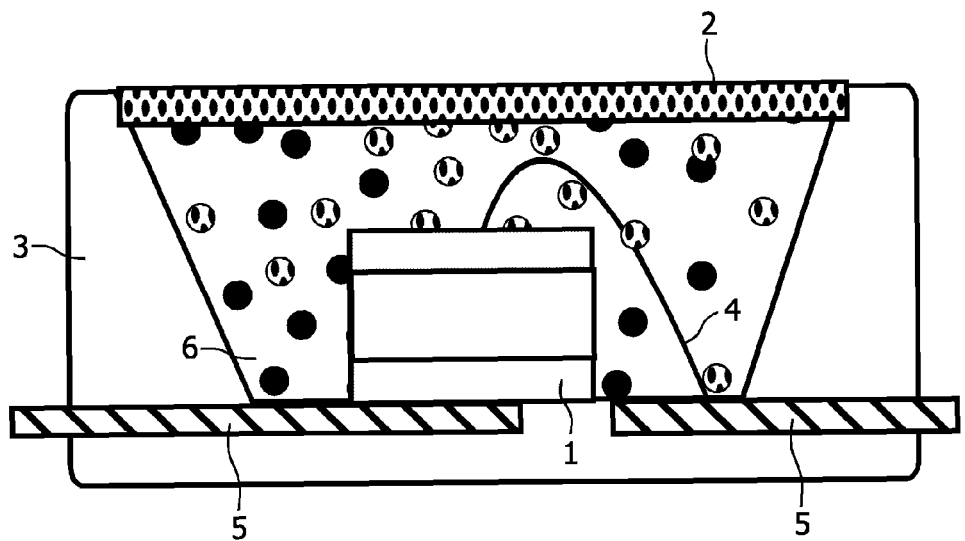
FIG. 2 shows a schematic side view of a trichromatic white LED lamp comprising a ceramic luminescence converter of the present invention positioned in the pathway of light emitted by a light-emitting diode lead-frame structure.
Figure 3:
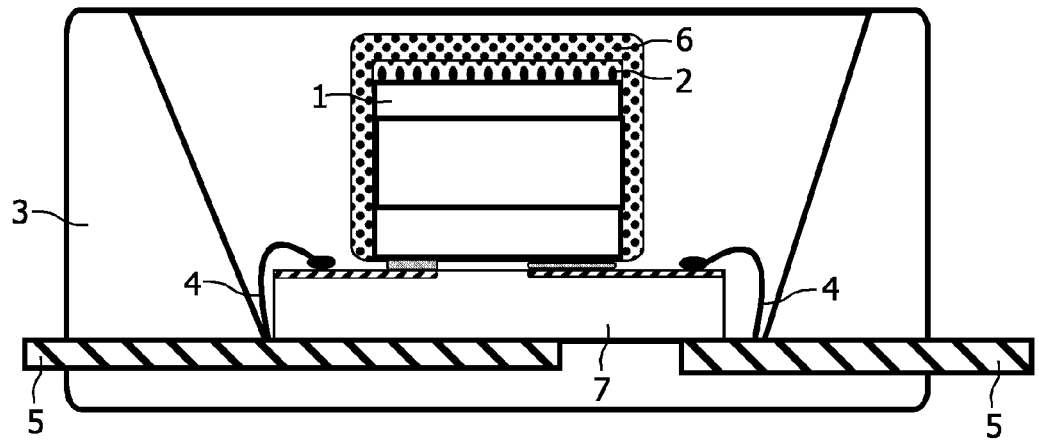
FIG. 3 shows a schematic side view of a trichromatic white LED lamp comprising a ceramic luminescence converter of the present invention positioned in the pathway of light emitted by a light-emitting diode flip chip structure.
Figure 4:
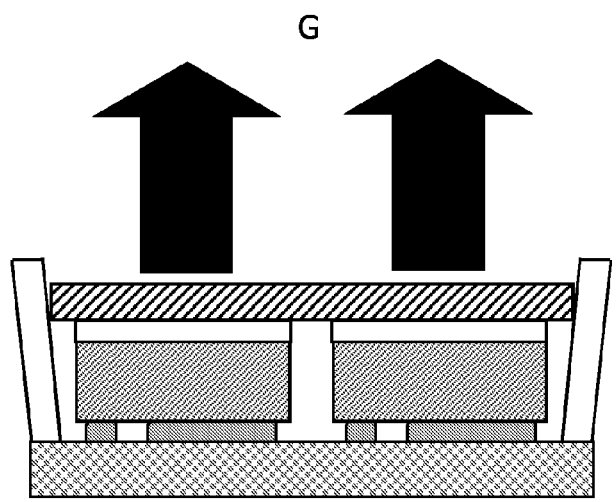
FIG. 4 shows a schematic side view of a dichromatic green lamp comprising a ceramic luminescence converter of the present invention positioned in the pathway of light emitted by a light-emitting diode flip chip structure.
Figure 5:
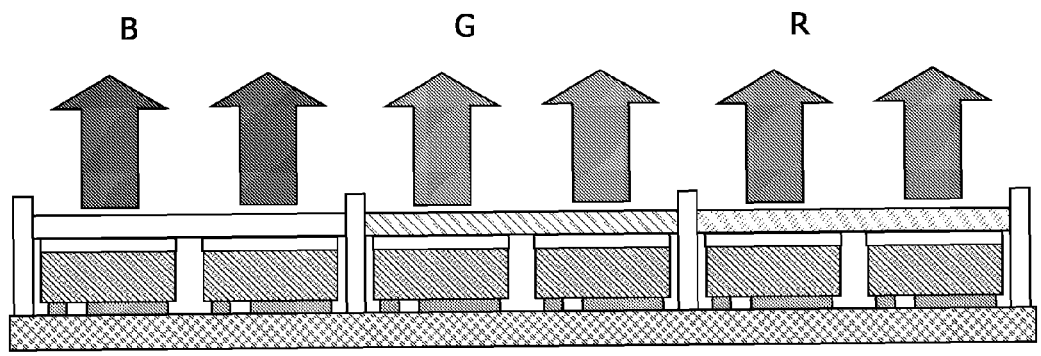
FIG. 5 shows a schematic side view of a RGB display comprising ceramic luminescence converters of the present invention positioned in the pathway of light emitted by a light-emitting diode flip chip structure.
Figure 6:
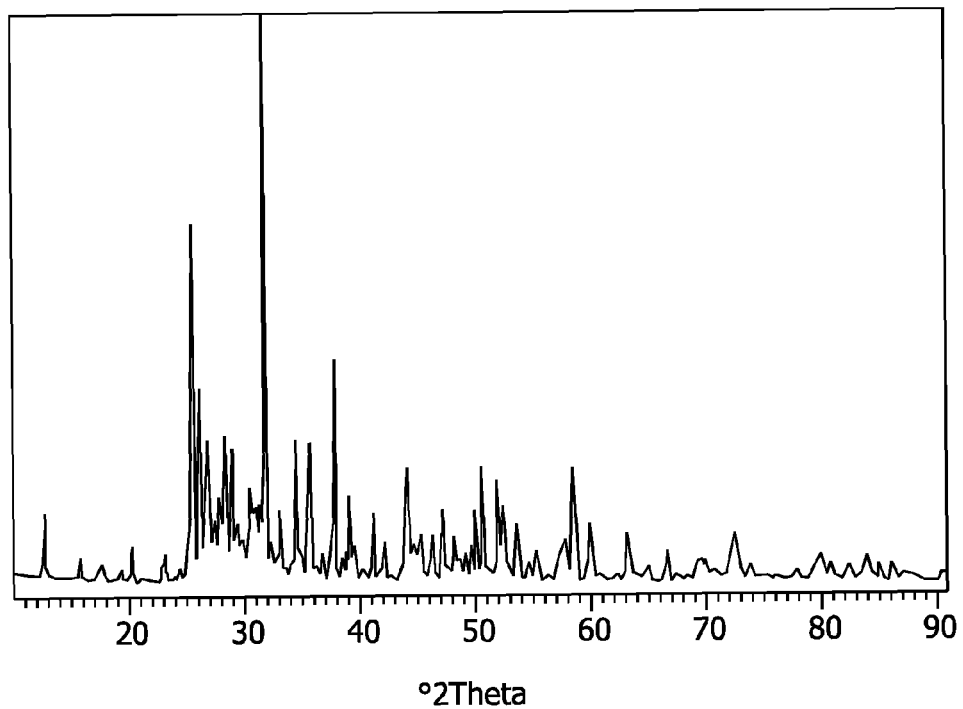
FIG. 6 shows an XRD pattern of a ceramic luminescence converter according to the invention measured by Cu K$\alpha$ radiation.
Figure 7:
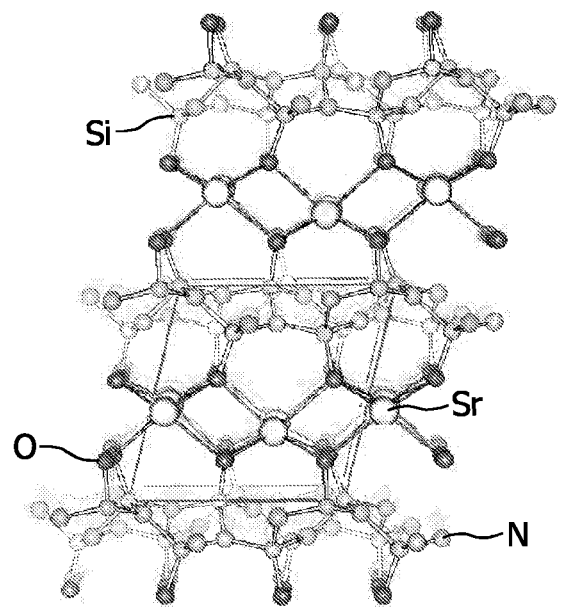
FIG. 7 shows the crystal structure model of $SrSi_2N_2O_2$:Eu.
Figure 8:
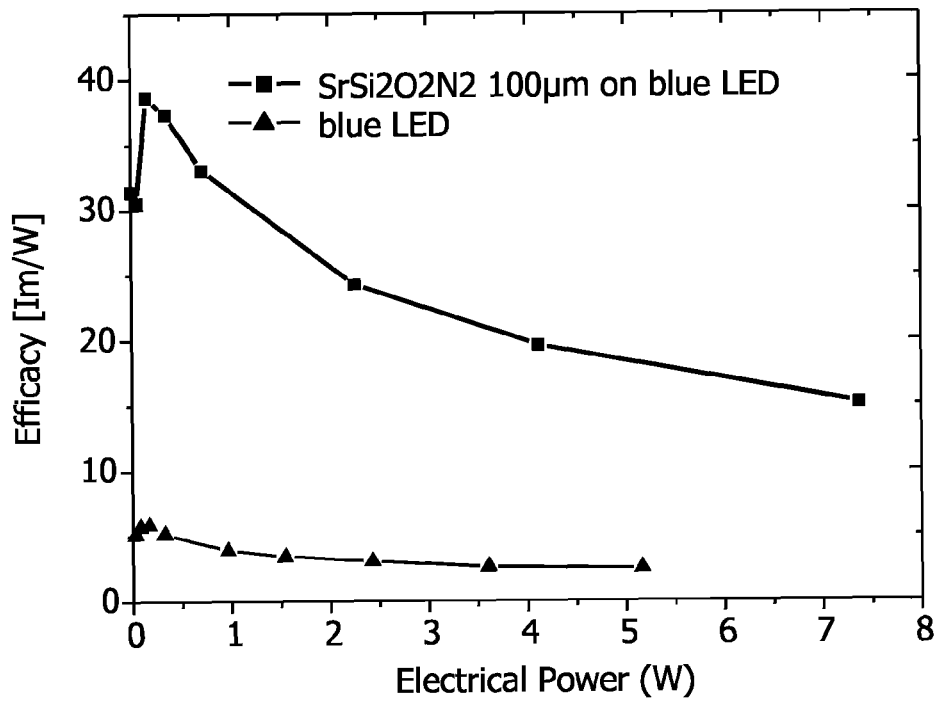
FIG. 8 shows the output characteristics of a green 539 nm CLC illumination system in comparison to those of a blue light emitting diode.

| | LIST OF NUMERALS |
|---|---|
| 1 | Light emitting diode |
| 2 | Monolithic ceramic luminescence converter |
| 3 | Reflector |
| 4 | Wirebond |
| 5 | Electrodes |
| 6 | Phosphor coating |
| 7 | Substrate |

The invention claimed is:

1. Illumination system comprising a radiation source and a monolithic ceramic luminescence converter comprising at least one phosphor capable of absorbing a part of the light emitted by the radiation source and emitting light of a wavelength different from that of the absorbed light, wherein said at least one phosphor is an europium(II)-activated oxonitridosilicate of the general formula $(Sr_{1-a-b-c-d-e-f}Ca_bBa_cMg_dZn_eCe_f)Si_{x-g}Ge_g\ N_yO_z:Eu_a$, wherein $0.001 \leq a \leq 0.2$, $0.0 \leq b \leq 1.0$, $0.0 \leq c \leq 0.5$, $0.0 \leq d \leq 0.25$, $0.0 \leq e \leq 0.25$, $0.0 < f \leq 0.2$, $0.0 < g < 1$, $1.5 \leq x \leq 2.5$, $1.5 \leq y \leq 2.5$ and $1.5 < z < 2.5$.

2. Illumination system according to claim 1, wherein said radiation source is a light emitting diode.

3. Illumination system according to claim 1, wherein said monolithic ceramic luminescence converter is a first luminescence converter element, said system further comprising one or more second luminescence converter elements.

4. Illumination system according to claim 3, wherein the second luminescence converter element is a coating comprising a phosphor.

5. Illumination system according to claim 3, wherein the second luminescence converter element is a second monolithic ceramic luminescence converter comprising a second phosphor.

* * * * *